United States Patent [19]

Wen et al.

[11] Patent Number: 5,274,342
[45] Date of Patent: Dec. 28, 1993

[54] MICROWAVE MONOLITHIC INTEGRATED CIRCUIT (MMIC) INCLUDING DISTRIBUTED CASCODE BIPOLAR TRANSISTOR AMPLIFIER UNIT

[75] Inventors: Cheng P. Wen, Mission Viejo; Chan S. Wu; Cheng K. Pao, both of Torrance, all of Calif.

[73] Assignee: Hughes Aircraft Company, Los Angeles, Calif.

[21] Appl. No.: 843,344

[22] Filed: Feb. 28, 1992

[51] Int. Cl.[5] .............................................. H03F 3/68
[52] U.S. Cl. ................................... 330/295; 330/311; 330/124 R
[58] Field of Search .................... 330/295, 124 R, 310, 330/311, 307; 307/303

[56] References Cited

U.S. PATENT DOCUMENTS

| | | | |
|---|---|---|---|
| 3,443,238 | 5/1969 | Fynn et al. | 330/311 |
| 4,250,463 | 2/1981 | Foster | 330/311 |
| 5,066,926 | 11/1991 | Ramachadran et al. | 330/295 |

OTHER PUBLICATIONS

GaAs Heterojunction Bipolar Transistors: A Second Generation Microwave Power Amplifier Transistor, J. A. Higgins, Microwave Journal, May 1991.

Primary Examiner—Robert J. Pascal
Assistant Examiner—Tan Dinh
Attorney, Agent, or Firm—Georgann S. Grunebach; Terje Gudmestad; W. K. Denson-Low

[57] ABSTRACT

A microwave monolithic integrated circuit (MMIC) (40), includes a substrate (60), and an input bus (62), output bus (64), ground bus (66) and bias bus (68) formed as striplines of a four-line coplanar waveguide on the substrate (60) with the input bus (62) and output bus (64) disposed between the ground bus (66) and bias bus (68). A plurality of spatially distributed cascode amplifier units (43) are formed on the substrate (60), each including an input heterojunction bipolar transistor (HBT) (42) connected in a common-emitter configuration, and an output HBT (44) connected in a common-base configuration. The input HBT (42) has an emitter ($E_1$) connected to the ground bus (66), a base ($B_1$) connected to the input bus (62) and a collector ($C_1$). The output HBT (44) has an emitter ($E_2$) connected to the collector ($C_1$) of the input HBT (42), a base ($B_2$) connected to the bias bus (68) and a collector ($C_2$) connected to the output bus (64). The distributed amplifier arrangement enables the HBTs (42,44) to operate with balanced electrical parameters and high thermal isolation and heat dissipation.

6 Claims, 2 Drawing Sheets

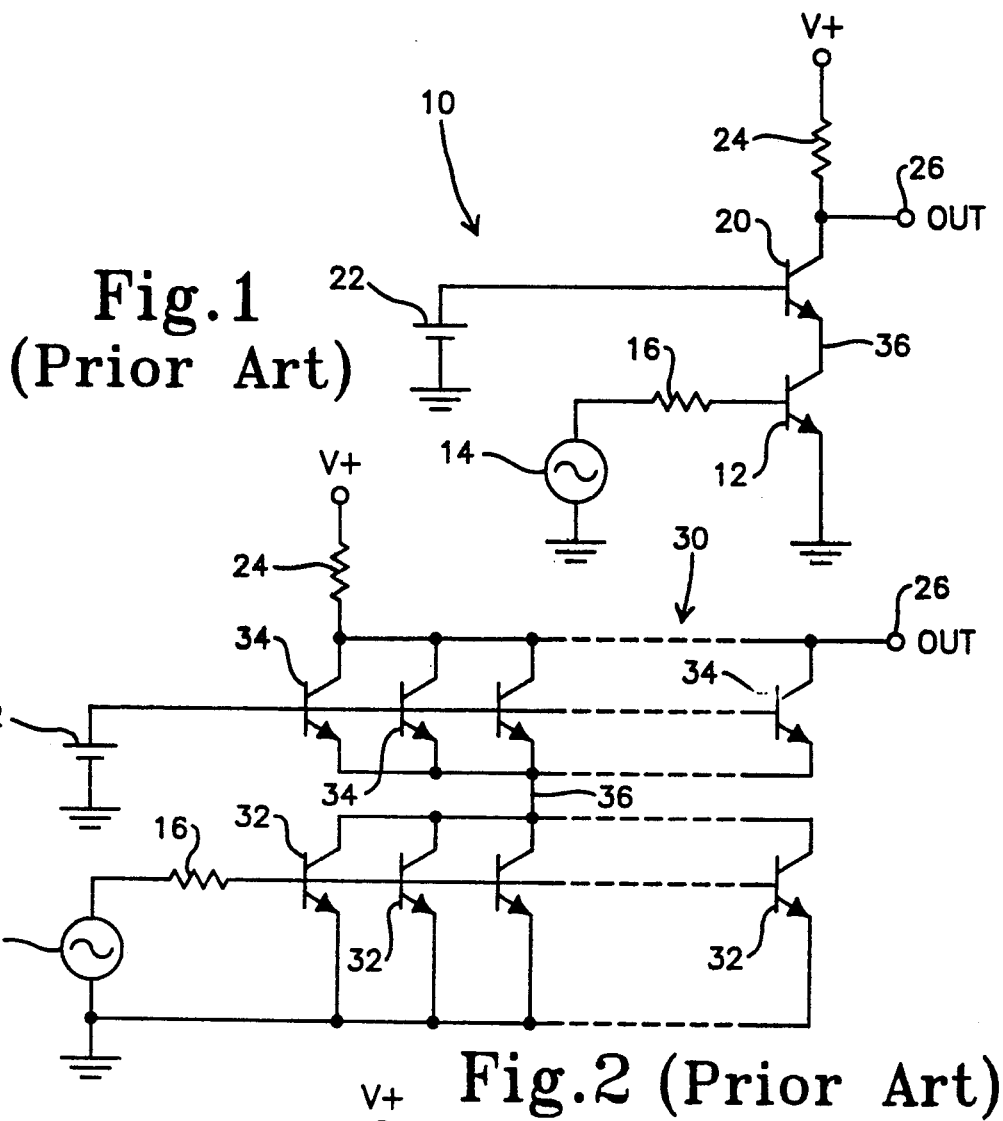
Fig.1 (Prior Art)
Fig.2 (Prior Art)
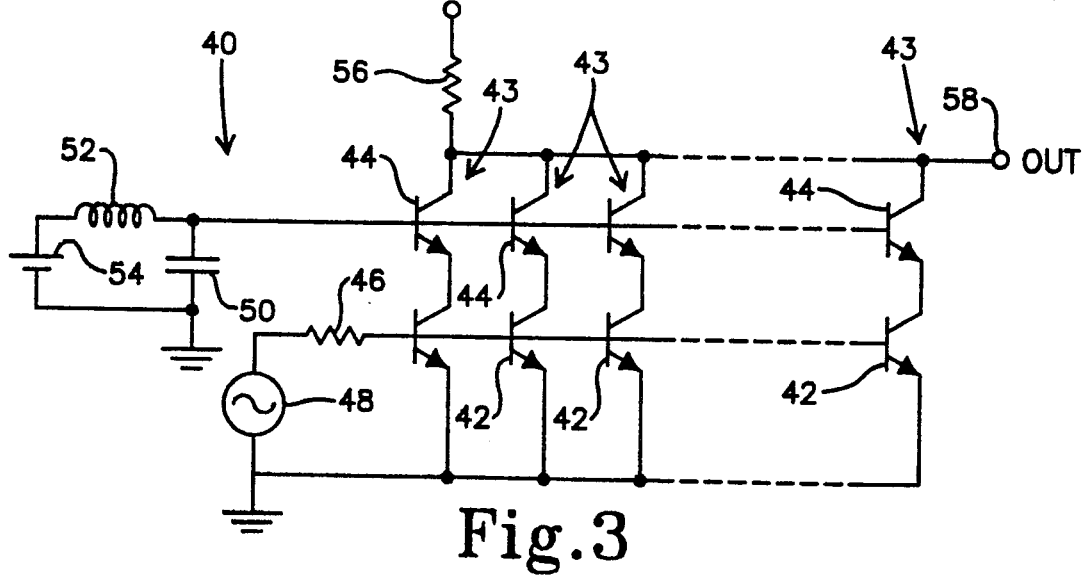
Fig.3

5,274,342

MICROWAVE MONOLITHIC INTEGRATED CIRCUIT (MMIC) INCLUDING DISTRIBUTED CASCODE BIPOLAR TRANSISTOR AMPLIFIER UNIT

BACKGROUND OF THE INVENTION

1. Field of the Invention

The present invention generally relates to monolithic microwave integrated circuits (MMICs), and more specifically to a distributed cascode MMIC amplifier arrangement utilizing heterojunction bipolar transistors (HBTs) with balanced electrical parameters and high thermal isolation and heat dissipation.

2. Description of the Related Art

The HBT enables more efficient microwave power amplification than is attainable with field-effect transistors (FETs) such as metal-semiconductor FETs (MESFETs) and high-electron-mobility transistors (HEMTs). The HBT offers high power density, sharp current cutoff and no degradation in voltage breakdown characteristics when operating in the class B/C high efficiency mode. However, the high power density of the HBT results in a smaller device footprint, placing severe demand on the thermal design and circuit layout for MMICs using HBT active elements.

In addition to the thermal problem, the Miller-effect capacitance at the input of a common-emitter HBT amplifier limits the achievable voltage gain and cutoff frequency. A cascode amplifier including a first HBT connected in a common-emitter configuration and a second HBT connected in a common-base configuration is commonly utilized in high power microwave amplification applications to reduce the Miller capacitance and resulting degenerative feedback.

A conventional cascode amplifier 10 is illustrated in FIG. 1 and includes an input NPN type HBT 12 having an emitter connected to ground. A radio frequency (RF) input signal is applied from a source 14 through an input resistor 16 to the base of the HBT 12. The collector of the HBT 12 is connected to the emitter of an output NPN type HBT 20, the base of which is connected to a direct current (DC) bias source 22. The collector of the HBT 20 is connected through an output resistor 24 to a voltage source V+, and also to an output terminal 26. A more detailed description of a conventional cascode amplifier may be found, for example, in a textbook entitled "Integrated Circuit Engineering—Design, Fabrication, and Applications", by A. Glaser et al, Addison-Wesley Publishing Co., 1979, pp. 495–499.

The common-emitter configuration of the HBT 20 substantially reduces the Miller capacitance between the output 26 and an input 36 thereof, reducing the degenerative Miller feedback and increasing the voltage gain and cutoff frequency above those which are attainable with a single common-emitter amplifier. The common-emitter configuration of the HBT 12 provides high current gain, whereas the common-base configuration of the HBT 20 provides high voltage gain without the need for a reactive matching network between the stages. For these reasons, the cascode amplifier is a desirable building block for MMICs.

Each of the cascode amplifier stages may include several smaller HBT cells or units to provide a high power amplifier as illustrated in FIG. 2, in which like elements are designated by the same reference numerals used in FIG. 1. A conventional distributed cascode MMIC amplifier 30 includes a plurality of first stage or input HBTs 32 which collectively correspond to the HBT 12 and a plurality of second stage or output HBTs 34 which collectively correspond to the HBT 20. The emitters, bases and collectors of the HBTs 32 and 34 are respectively interconnected. The collectors of all of the HBTs 32 are connected to the emitters of all of the HBTs 34. This type of distributed cascode MMIC amplifier is described in more detail in "Microwave Journal", Vol. 34, No. 5, May 1991, pp. 189–191.

In the amplifier 30, the input signal from the source 14 is divided among the input stage HBTs 32, amplified and recombined at the collectors thereof. The combined output of the HBTs 32 is divided again among the output stage HBTs 34, amplified and recombined at the output terminal 26. Constraints such as equal in-phase delay of RF signals propagating through the individual HBTs 32 and 34 and equal bias voltage application from the source 22 to the HBTs 34 are imposed on the amplifier circuit design layout. These requirements must be satisfied with a compact circuit configuration having minimum spacing between adjacent HBTs.

On the contrary, high thermal isolation and heat dissipation is achieved by locating the HBTs as far away from each other as possible. These conflicting MMIC circuit design requirements limit the adaptability of the amplifier 30, since the HBTs of the two stages are interconnected at both their inputs and outputs. Reducing the spacing between HBTs to accommodate efficient in-phase signal delay is detrimental to the amplifier thermal properties, and vice-versa.

Another problem with the prior art amplifier 30 is that it is prone to thermal runaway. In a typical design, the HBTs 32 and 34 are biased such that the collector-emitter (collector-ground) voltage drop of the HBTs 32 is relatively low, on the order of 2 volts, whereas the collector-emitter voltage drop of the HBTs 34 is much higher, on the order of 8 volts. Although the collector currents of the HBTs 32 and 34 are equal, the HBTs 34 consume more power than the HBTs 32 due to the higher voltage drop, and thereby generate more heat and operate at a higher temperature.

A fundamental property of bipolar transistors is that as the operating temperature increases, the current flow through the transistor also increases. Above a certain point, the process becomes uncontrollably divergent, and the current flow increases to a level which results in destruction of the transistor. This is the phenomenon of thermal runaway. The configuration of FIG. 2 is especially conducive to thermal runaway since the combined current at the collectors of the HBTs 32 is much greater than the current handling capacity of a single HBT 34.

During normal operation, the current is equally distributed through the HBTs 34 and there is no problem. However, if the HBTs 34 are even slightly mismatched, one HBT 34 will operate at a higher temperature than the other HBTs 34 and draw a larger amount of current. Since the combined current from the HBTs 32 is much more than enough to cause thermal runaway of the hot HBT 34, the possibility that this will occur and that not only one HBT 34, but all of the HBTs 34 will be destroyed in a chain reaction, is greatly enhanced. This is because, as each HBT 34 is destroyed, the remaining HBTs 34 must accommodate not only their own fraction of the total current, but also the current which was previously handled by the destroyed HBTs 34.

SUMMARY OF THE INVENTION

The present invention provides a compact, high power MMIC distributed cascode HBT microwave signal amplifier, including a plurality of distributed amplifier cells or units formed on a common substrate. Each cascode amplifier unit is a two-stage device having a common-emitter input stage and a common-base output stage.

More specifically, a MMIC amplifier arrangement embodying the present invention includes a substrate, and an input bus, output bus, bias bus and ground bus formed as striplines of a four-line coplanar waveguide on the substrate with the input bus and output bus disposed between the bias bus and ground bus.

A plurality of distributed cascode amplifier units are formed on the substrate, each including an input bipolar transistor, preferably an HBT, connected in a common-emitter configuration, having an emitter connected to the ground bus, a base connected to the input bus and a collector. An output HBT is connected in a common-base configuration, having an emitter connected to the collector of the input transistor, a base connected to the bias bus and a collector connected to the output bus. Each amplifier unit further includes a capacitor connected between the bias bus and the ground bus to short RF signals from the bias bus to ground.

The present invention provides advantages over conventional HBT MMIC amplifiers including the following.

1. High cutoff frequency due to the reduced Miller feedback achieved by the cascode two-stage amplifier units.

2. Improved thermal characteristics, lower transistor operating temperature and increased reliability due to the distributed amplifier configuration.

3. Improved design flexibility and higher gain bandwidth product due to the higher cutoff frequency.

4. High output power capability due to power combining of the amplifier units.

5. Resistance to thermal runaway since the current flow through each output HBT is limited to the current flow through the single respective input HBT which operates at low temperature.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 1 is an electrical schematic diagram of a conventional cascode amplifier;

FIG. 2 is an electrical schematic diagram of a prior art distributed cascode amplifier;

FIG. 3 is an electrical schematic diagram of a distributed cascode HBT MMIC amplifier embodying the present invention.

DETAILED DESCRIPTION OF THE INVENTION

Figure 4:
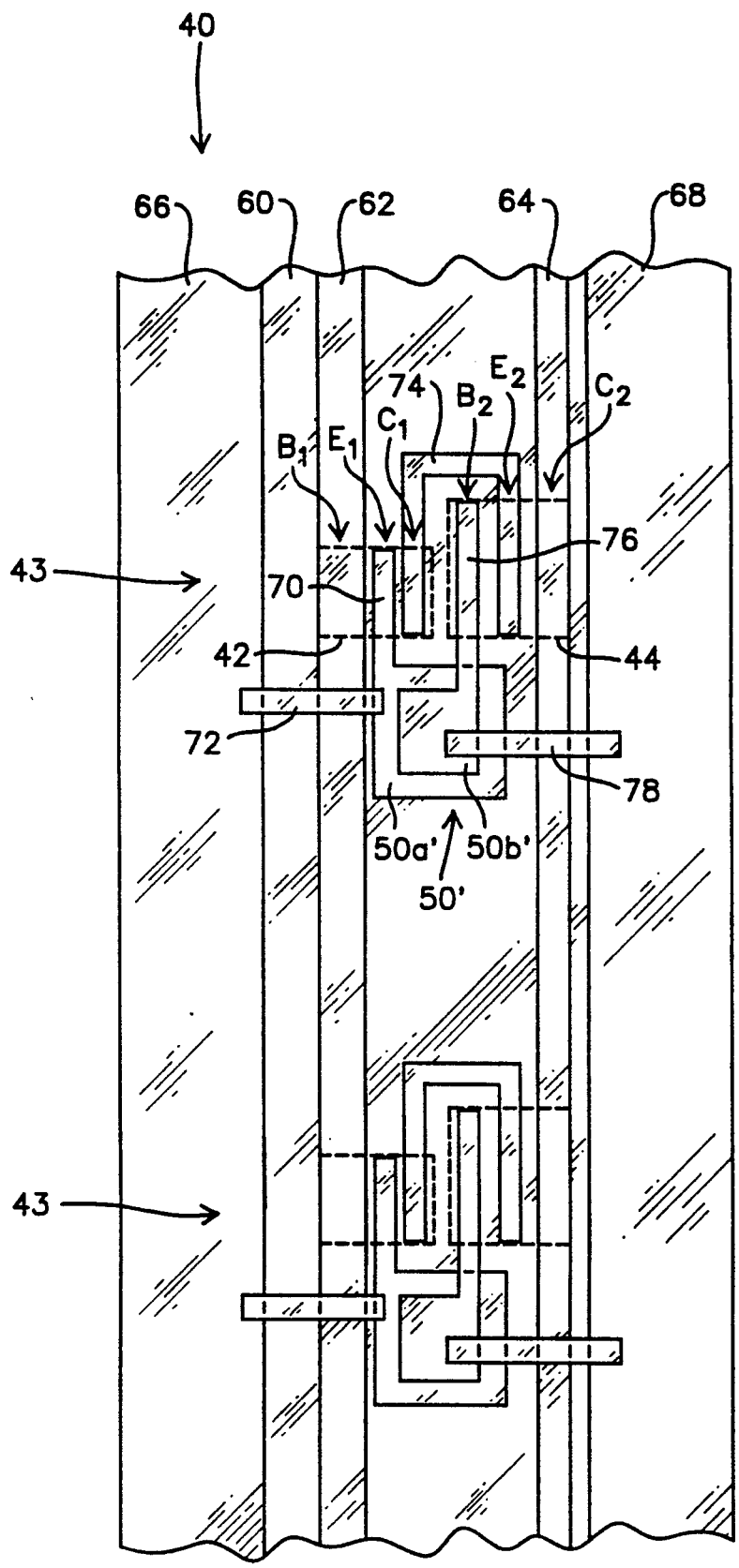
FIG. 4 is a simplified plan view of the MMIC amplifier of FIG. 3.

As illustrated in FIG. 3, a MMIC amplifier embodying the present invention is generally designated as 40, and includes a plurality of first stage or input NPN type HBTs 42 and a plurality of second stage or output NPN type HBTs 44. In an alternative embodiment of the invention, the HBTs 42 and 44 may be replaced by homojunction bipolar transistors. Of course, the scope of the invention also includes providing the transistors 42 and 44, whether heterojunction or homojunction, as PNP type, with the relative polarities reversed.

The HBTs 42 are connected in a common-emitter configuration, with their emitters grounded and their bases connected through an input resistor 46 to a microwave RF signal source 48. The collectors of the HBTs 42 are connected to the emitters of the respective HBTs 44.

The HBTs 44 are connected in a common-base configuration, with their bases connected through a capacitance 50 to ground, and also through an inductance 52 to a DC bias voltage source 54. The capacitance 50 is selected to provide a low (as close to zero as practical) value of capacitive reactance at the operating frequency of the amplifier 40, and thereby act as a high-pass filter and short any RF signals present at the bases of the HBTs 44 to ground, while providing high (as close to infinite as practical) isolation between the bases of the HBTs 44 and ground for the DC bias voltage. The inductance 52 acts as a low-pass filter which prevents RF signals from reaching the bias source 54. The collectors of the HBTs 44 are connected through an output resistor 56 to a voltage source V+, and also to an output terminal 58.

In operation, each interconnected pair of HBTs 42 and 44 constitutes and operates as a separate cascode amplifier unit 43, with the input signal from the source 48 being substantially equally divided between the amplifier units 43. The cascode configuration provides each amplifier unit 43 with low Miller capacitance, and thereby low degenerative Miller feedback, high voltage gain and high cutoff frequency. Since the amplifier units 43 are separate from each other, there is no in-phase signal delay mismatch due to interconnect circuitry between the two amplifier stages as in the prior art configuration of FIG. 2. Any practical number of cascode amplifier units 43 can be provided to produce a required value of output power by combining the power outputs of the amplifier units 43.

FIG. 4 illustrates an exemplary arrangement of two spatially distributed amplifier units 43 fabricated on an insulating or semi-insulating substrate 60 which is preferably a gallium arsenide (GaAs) wafer. The elements of only the upper amplifier unit 43 are designated with reference numerals, so that the detailed configuration can be seen more clearly in the lower unit. A four-line coplanar waveguide includes four substantially parallel microstrip lines in the form of an input bus 62 which is connected to the source 48 through the resistor 46, an output bus 64 which is connected to the output terminal 58, a ground bus 66, and a bias bus 68 which is connected to the bias source 54 through the inductance 52. The input bus 62 and output bus 64 are disposed between the ground bus 66 and bias bus 68.

The HBTs 42 and 44 are formed in the substrate 60 using known fabrication technology which is not the subject matter of the present invention, and are indicated by broken line rectangles. The emitter, base and collector of the HBT 42 are designated as $E_1$, $B_1$ and $C_1$, whereas the emitter, base and collector of the HBT 44 are designated as $E_2$, $B_2$ and $C_2$ respectively. The capacitance 50 is collectively provided by individual capacitors 50' of the respective amplifier units 43. The capacitor 50' includes a first electrode or plate $50a'$ which is connected to the emitter $E_1$ of the HBT 42 by a stripline 70. The first plate 50a' is also connected to the ground bus 66 by an airbridge 72 which extends over the input bus 62 without making electrical contact therewith. The capacitance of the capacitor 50' depends on the particular circuit design and operating frequency, with a typical value being 100 picofarads at 10 Ghz.

The base $B_1$ of the HBT 42 is connected to the input bus 62, whereas the collector $C_1$ thereof is connected through a stripline 74 to the emitter $E_2$ of the HBT 44. The base $B_2$ the HBT 44 is connected through a stripline 76 to a second electrode or plate 50b' of the capacitor 50', whereas the collector $C_2$ is connected to the output bus 64. The second plate 50b' of the capacitor 50' is connected to the bias bus 68 by an airbridge 78 which extends over the output bus 64 without making electrical contact therewith. It will be noted that the capacitor 50' is connected between the ground bus 66 and bias bus 68 by the air bridges 72 and 78.

The present invention overcomes the conflicting design requirements of equal in-phase signal delay, equal voltage biasing and thermal isolation and heat dissipation which are inherent in the prior art configuration of FIG. 2. Since the output signals of the first stage HBTs 42 are not recombined at the inputs of the second stage HBTs 44, the phase matching constraint is eliminated and the HBTs 42 and 44 need not be distributed with an excessively small unit spacing. This enables the spacing between the HBTs 42 and 44 and the amplifier units 43 to be increased to a larger value at which the required thermal characteristics can be readily accommodated, and thereby provides reduced operating temperature of the HBTs 42 and 44 and increased reliability of the amplifier 40.

In addition, the MMIC amplifier 40 is highly resistant to thermal runaway. The input HBTs 42 operate at a typically low collector-emitter voltage on the order of 2 volts, which is far below the level at which thermal runaway would occur. The current through the output HBTs 44 is thereby limited to the current flow through the respective single input HBTs 42. Although the output HBTs 44 have a higher collector-emitter voltage on the order of 10 volts and operate at a higher temperature than the input HBTs 42, the current limiting action of the input HBTs 42 positively prevents them from drawing excessive current and thereby exhibiting thermal runaway.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A distributed cascode amplifier, comprising
    an input bus;
    an output bus;
    a bias bus;
    a ground bus;
    a plurality of cascode amplifier units, each including;
        a first transistor having an emitter connected to the ground bus, a base connected to the input bus and a collector;
        a second transistor having an emitter connected to the collector of the first transistor, a base connected to the bias bus and a collector connected to the output bus; and
    a substrate, in which:
        the input bus, output bus, bias bus, ground bus and amplifier units are formed on the substrate; and
        the input bus, output bus, bias bus and ground bus extend substantially parallel to each other as striplines of a four-line coplanar waveguide with the input bus and output bus disposed between the bias bus and ground bus and being electrically shielded thereby.

2. An amplifier as in claim 1, further comprising capacitance means connected between the bias bus and the ground bus and having a value of capacitance selected to provide a predetermined low value of capacitive reactance at a predetermined operating frequency.

3. An amplifier as in claim 1, in which the first and second transistors of each amplifier unit are heterojunction bipolar transistors (HBTs).

4. An amplifier as in claim 1, in which each amplifier unit further comprises;
    a first stripline connecting the collector of the first transistor to the emitter of the second transistor;
    a first airbridge extending over the input bus and connecting the emitter of the first transistor to the ground bus; and
    a second airbridge extending over the output bus and connecting the base of the second transistor to the bias bus.

5. An amplifier as in claim 4, in which each amplifier unit further comprises a capacitor connected between the emitter of the first transistor and the second airbridge and having a capacitance selected to provide a predetermined low value of capacitive reactance at a predetermined operating frequency.

6. An amplifier as in claim 5, in which:
    the capacitor has first and second plates; and
    each amplifier unit further comprises:
        a second stripline connecting the emitter of the first transistor to the first plate of the capacitor; and
        a third stripline connecting the second airbridge to the second plate of the capacitor.

* * * * *